United States Patent [19]
Taylor et al.

[11] Patent Number: 4,503,403
[45] Date of Patent: Mar. 5, 1985

[54] OPTICAL INJECTION LOCKING OF SOLID-STATE OSCILLATORS BY FREQUENCY-MULTIPLEXED INJECTION-LOCKED, LASER DIODES

[75] Inventors: Henry F. Taylor; Lew Goldberg, both of Alexandria, Va.; Christen Rauscher; Joseph F. Weller, both of Fort Washington, Md.

[73] Assignee: The United States of America as represented by the Secretary of the Navy, Washington, D.C.

[21] Appl. No.: 536,588

[22] Filed: Sep. 28, 1983

[51] Int. Cl.³ .................... H03R 21/01; H03B 17/00
[52] U.S. Cl. ........................................ 331/37; 331/47; 331/55; 331/66; 331/117 FE; 331/173; 455/619
[58] Field of Search .............. 331/37, 42, 47, 55, 331/66, 117 FE, 172, 173; 455/609, 610, 619; 372/18, 28

[56] References Cited

U.S. PATENT DOCUMENTS

| | | | |
|---|---|---|---|
| 3,437,955 | 4/1969 | Enloe et al. | 455/609 X |
| 3,662,289 | 5/1972 | Dienst | 331/66 X |
| 4,105,949 | 8/1978 | Hardin | 331/37 |
| 4,264,875 | 4/1981 | Hunsperger et al. | 331/66 |
| 4,468,766 | 8/1984 | Spezio | 370/3 |
| 4,481,485 | 11/1984 | Carruthers et al. | 331/66 |

FOREIGN PATENT DOCUMENTS 127706 10/1980 Japan ................ 331/66

OTHER PUBLICATIONS

IEEE, vol. 61, No. 10, pp. 1386–1410, Oct. 1973, Kurokawa, K. "Injection Locking of Microwave Solid–State Oscillators", *Proceedings of the IEEE*.
*App. Phys. Lett.* 36, 8, pp. 680–683, Apr. 15, 1980, Yen, H. W. "Optical Injection Locking of Si IMPATT Oscillators".
*Appl. Phys. Lett.*, 32 (3), pp. 182–184, Feb. 1, 1978, Yen, H. W. et al., "Optical Injection Locking and Switching of Transistor Oscillators".
*Appl. Phys. Lett.* 38 (5), pp. 392–394, Mar. 1, 1981, Salles, A. A. et al., "Initial Observations of Optical Injection Locking of GaAs Metal Semiconductor Field Effect Transistor Oscillators".
*Electron Lett.*, vol. 18, No. 23, pp. 1019–1020, Nov. 11, 1982, Goldberg, L. et al., "FM Sideband Injection Locking of Diode Lasers".
*IEEE J. Quantum Electron.*, Apr. 1982, Soichi Kobayashi et al., "Direct Frequency Modulation in AlGaAs Semiconductor Lasers", pp. 1–14.

*Primary Examiner*—Eugene R. LaRoche
*Assistant Examiner*—D. C. Mis
*Attorney, Agent, or Firm*—Robert F. Beers; William T. Ellis

[57] ABSTRACT

The optical injection-locking of an FET oscillator is accomplished by injecting the beat signal between two coherently mixed slave lasers, which are locked to different harmonics of a modulated master laser, into the FET oscillator to be locked. 120 GHz injection-locking beat signals are possible using this technique.

4 Claims, 2 Drawing Figures

OPTICAL INJECTION LOCKING OF SOLID-STATE OSCILLATORS BY FREQUENCY-MULTIPLEXED INJECTION-LOCKED, LASER DIODES

BACKGROUND OF THE INVENTION

The present invention relates generally to frequency locking for oscillators, and in particular, to the optical injection locking of solid state oscillators.

There are numerous military applications for microwave or millimeter-wave radiation from 10 GHz to 100 GHz. Such applications include a variety of imaging and seeking systems. A basic element of these systems is the solid state oscillator in which typically a field-effect transistor (FET), a transferred-electron diode (TED), or an impact ionization avalanche transit time (IMPATT) diode serves as the radiation source. The major requirements for these sources are stability both in phase and frequency, reliability, and capability for high-power operation. Also, compactness and cost can be important considerations depending on the application under consideration.

However, each solid state oscillator type mentioned above suffers from thermal instability resulting in frequency shifting. Also, some of these devices are limited in power output, so that techniques in power combining must be utilized. Power combining techniques require all sources to operate at the same frequency and to be correlated in phase in order to eliminate random fluctuations and frequency jitter.

A standard technique for stabilizing the frequency and phase of solid state oscillators comprises injection locking the oscillator to the frequency of an external signal. This technique is commonly used for frequency locking microwave IMPATT and FET transistor oscillators in order to reduce frequency jitter. The technique is also used for phase locking several slave oscillators to a single master oscillator. Recently, the injection locking of a microwave oscillator by illuminating the active region of the FET or IMPATT with an optical signal which is intensity modulated at the oscillating frequency or at one of its subharmonics was demonstrated. See H. W. Yen and M. K. Barnoski, Applied Physics Letters 32, 182, (1978); A. A. Salles and T. R. Forrest, Applied Physics Letters 38, 292 (1981); and H. W. Yen, Applied Physics Letters 36, 680 (1980). The advantages to such optical injection locking are, (i) high frequency carrier density fluctuations can be directly generated in the active areas of the device without electrical contacts and without the associated problems arising from stray impedance, reflections etc., and (ii) the distribution of the high frequency locking signal to many oscillators can be readily accomplished using optical fibers. However, using a standard current modulated GaAlAs laser as the source of the injecting optical signal, the maximum $\nu_m$ at which the fundamental frequency locking can occur is restricted by the laser's limited frequency response. In essence, such laser diodes cannot be current modulated above 4 GHz due to the rate equations describing photon and carrier densities within the laser diode cavity. Thus, optical injection locking at frequencies in the 10–100 GHz range cannot be achieved in the prior art.

OBJECTS OF THE INVENTION

Accordingly, it is an object of the present invention to frequency and phase lock a microwave oscillator by means of optically injected signals.

It is a further object of the present invention to frequency and phase lock a microwave oscillator at its fundamental frequency by means of an optically generated signal.

It is yet a further object of the present invention to obtain very high frequency locking of a microwave oscillator.

It is a further object of the present invention to injection lock a microwave oscillator without adding external electrical connections with their attendant stray inductances and capacitances.

It is yet a further object of the present invention to optically lock a plurality of microwave oscillators to the same master oscillator system thereby facilitating power combination.

Other objects, advantages, and novel features of the present invention will become apparent from the detailed description of the invention, which follows the summary.

SUMMARY OF THE INVENTION

Briefly, the present invention is a system for frequency and phase locking a solid state oscillator by means of the optical injection of a coherently mixed signal. This system comprises a master laser for generating an optical output at a frequency $f_o$; a circuit for applying an RF signal at a frequency $f_I$ to the master laser in order to cause the master laser to generate optical sidebands at multiples of $f_I$; a first slave laser adjusted to operate at approximately the frequency location of a given optical sideband of the master laser; a second slave laser adjusted to operate at approximately the frequency location of a different optical sideband of the master laser than the first slave laser; a beam splitter for splitting the optical output from the master laser into at least two beams and injecting one beam into the first slave laser and injecting the other beam into the second slave laser; and a device for combining the optical output beams from the first and second slave lasers and impinging this combined beam on the solid state oscillator to effect a locking of that oscillator to the beat frequency between the two slave laser outputs.

The optical injection beat signal has a spectrum which is much narrower than the free-running laser linewidth because the phases of the two slave lasers are both correlated with the random phase fluctuations of the master laser. Using the foregoing system, it is possible to obtain a beat signal on the order of 120 GHz. Thus, it is now possible to stabilize and control the phase and the frequency of microwave oscillators operating at many tens of GHz.

DETAILED DESCRIPTION OF THE PREFERRED EMBODIMENT

Figure 1:
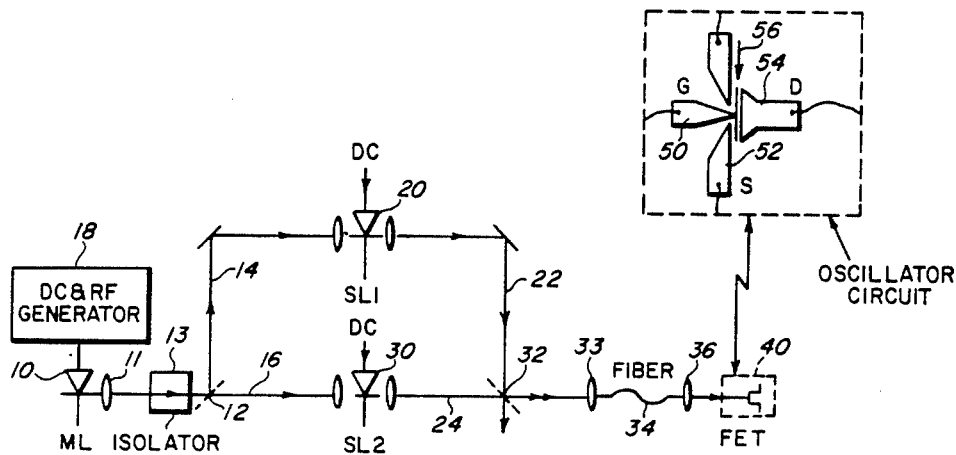
FIG. 1 is a schematic diagram of one embodiment of the present invention.

Referring now to FIG. 1, there is disclosed a preferred embodiment of the present invention. In essence, a master laser 10 is modulated in order to obtain a plurality of harmonics. The output optical beam from this master laser 10 is then split in a beam splitter 12, and a first beam is applied via path 14 to a first slave laser 20 to frequency and phase lock that slave laser 20 to one of the harmonics of the master laser. Likewise, the second beam from the beam splitter is applied via the path 16 to second slave laser 30 to frequency and phase lock that slave laser to a different harmonic of the master laser than the first slave laser. The optical outputs from the slave lasers 20 and 30 are combined in a combining device 32. The combined signal is applied via an optical fiber 34 to impinge on the appropriate area of a solid state microwave oscillator 40. The microwave oscillator is frequency and phase locked to the beat signal resulting from the mixing of the output signals from the first and second slave lasers 20 and 30.

Figure 2:
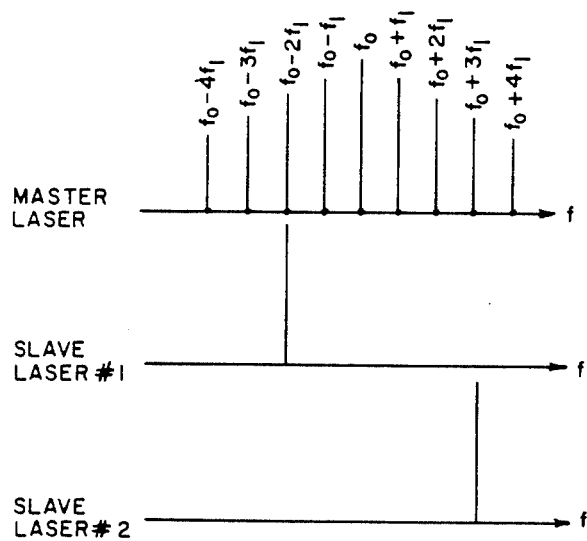
FIG. 2 is a graphical representation of the frequency output of a master laser and two slave lasers.

A more detailed discussion of FIG. 1 will now be made. As noted above, the master laser diode 10 is FM-modulated to generate sidebands on each side of the laser carrier frequency $f_o$. This sideband generation is accomplished by first biasing the master laser with a DC power supply and adjusting the current through the master laser to obtain laser action. The master laser 10 initially operates in a single longitudinal mode generating at an optical frequency $f_o$. Then, an RF current at a frequency $f_l$ is superimposed on the DC current, thus generating sidebands at multiples of $f_l$. The DC power supply and the RF current generator are represented by the block 18 in the drawing. As is well known, the number and the intensity of the sidebands generated by the foregoing operation depends on the RF current and the laser structure. The harmonic spectrum for the master laser is shown in FIG. 2. For purposes of illustration, the master laser is depicted as having 4 sidebands on each side of the carrier frequency $f_o$.

The optical output from the master laser 10 with its harmonics is then applied through the lens 11 and isolator 13 to the aforementioned beam splitter 12. The isolator operates to pass light in only one direction thereby preventing reflections from propagating back into the master laser cavity. The isolator may be realized simply by a standard commercial unit employing the Faraday effect.

The split optical beams are then applied via the optical paths 14 and 16 to the slave lasers 20 and 30. The slave lasers are each tuned to operate near a different harmonic of the master laser 10. In the example shown in FIG. 2, slave laser 20 is adjusted to operate at close to the frequency location $f_o - 2f_l$, while the slave laser 30 is adjusted to operate close to the frequency location $f_o + 3f_l$. This adjustment in frequency and output wavelength is accomplished by temperature and/or current tuning of the free-running frequencies of the lasers to approximately match the appropriate sideband. In the present case, the laser diodes are approximately matched in output wavelength to ±20 Angstroms.

As is well known in the art, if an external signal from a master oscillator is injected into the cavity of the slave oscillator and certain conditions in frequency and power for each of the oscillators are met, then the slave oscillator frequency is pulled in to the master frequency. The conditions for this locking bandwidth mechanism are as follows:

$$\Delta F_m = \frac{F_m}{Q_{ext}} \sqrt{\frac{P_i}{P_o}}$$

-continued $$\Delta W_m = \frac{W_m}{Q_{ext}} \sqrt{\frac{P_i}{P_o}}.$$

In the foregoing equations, $Q_m$ is the external cavity Q of the resonant circuit, $P_i$ is the injection power from the master oscillator, $P_o$ is the free-running power from the slave oscillator, $f_m$ is the master oscillator frequency. Accordingly, it can be seen that if the slave laser 20 is close to the $f_o - 2f_l$ sideband of the master laser 10, and sufficient master laser power is injected into the slave laser, then slave laser 20 will oscillate at the frequency $f - 2f_l$. Similarly, if slave laser 30 is close to the $f_o + 3f_l$ sideband of the master laser 10, then after injection the slave laser will oscillate at that frequency $f_o + 3f_l$.

The output optical beams from the slave lasers 20 and 30 are then applied to the combining device 32 via the optical paths 22 and 24, respectively. The output from the combining device 32, which may be realized by a beam splitter, is then focused by a lens 33 into a single mode fiber 34. The light from the optical fiber 34 is then focused via a lens 36 into the microwave oscillator 40 to be locked. In FIG. 1, an FET oscillator is shown as the microwave device 40 by way of example. A top view blowup of the FET 40 is illustrated above block 40 in the figure. G, D, and S represent the gate, drain, and source respectively. The elements 50, 52, and 54 represent the electrodes for the gate, source, and drain, respectively. By way of example, the injection-locking beat signal from the optical fiber 34 may be applied to the approximate 10 micron gap between the drain and the source designated by the arrow 56. In general, for an FET oscillator the light should be applied between the gate and the drain regions and the gate and the source regions, or some portion of one or both of these regions. In a planar Gunn diode, the entire region between the anode and the cathode, or some portion of that region can be illuminated. If an IMPATT diode is used, an optical fiber can be employed to couple the light into the oscillator cavity so that the edges of the IMPATT can be illuminated.

The result of the application of the combined beams from the slave lasers is a coherent mixing which produces a photo current in the oscillator circuit at the beat frequency of the two slave lasers. In the example used in the present case this beat frequency corresponds to a frequency of $3f_l - (-2f_l) = 5f_l$. If sufficient current is generated by this beat signal and the optically generated beat signal is sufficiently near to the operating frequency of the microwave oscillator 40, then this microwave oscillator will be begin to oscillate at the optically generated beat frequency.

In one experiment carried out by the present inventors, two GaAlAs slave lasers 20 and 30 were utilized. The master laser was FM modulated by a 2.5 GHz sinusoidal signal superimposed on its DC bias current. The FM index was $\beta = 1.0$. Two prominent sidebands were observed located at ±2.25 GHz from the carrier. Accordingly, the slave lasers 20 and 30 were injection locked to the ±1 FM sidebands. The injected power was adjusted so that the locking bandwidth was substantially less than 2.25 GHz. When the slave lasers were injection locked and the output optical beams therefrom were combined, the resulting beat signal appeared at 4.5 GHz with a 3 dB spectral width of less than 20 kHz. It should be noted that this beat spectrum is much narrower than the free-running laser linewidth (approximately 20 MHz) because the phases of the slave lasers 20 and 30 are both correlated with the random phase fluctuations of the master laser.

The output of the optical fiber 34 in this experiment was approximately 200 μW. This optical output signal was focused onto the FET gate region with a spot size of 10 μm approximately equal to the source-to-drain distance of the FET. The FET to be injection locked was mounted in an oscillator circuit and biased to oscillate at 4.5 GHz. The slave laser beat frequency was then adjusted until it was within a few MHz of 4.5 GHz. Injection locking of the FET resulted in spectral narrowing and frequency stabilization of the microwave signal.

To summarize, a new technique and system has been disclosed based on the coherent mixing of the optical outputs from slave lasers which are locked to the harmonics of a master laser. The beat signal from this coherent mixing operation is then utilized to injection-lock a microwave device.

The present technique allows a microwave oscillator to be frequency and phase locked at its fundamental by an optical generated signal. By injection locking to high order master laser sidebands, the present technique permits very high frequency locking now unobtainable by either direct modulation (limited to 4 GHz) or external modulation (demonstrated only to 20 GHz). The minimum locking frequency for this technique is simply $f_l$, obtained by locking the microwave device to the carrier $f_o$ and one of its sidebands. The maximum locking signal frequency is $2nf_l$, where n is the maximum number of sidebands. At present, for commercially available laser diodes, the maximum frequency $f_l$ is 4 GHz. If 15 sidebands can be generated to each side of the optical carrier, it is possible that a 120 GHz beat signal could be generated optically, which cannot now be done by direct or external modulation.

Finally, it should be noted that with the present technique many microwave oscillators can be locked to the same master oscillator system simply by using fiber optic couplers or beam splitters, thus making power combining operations significantly easier.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A system for frequency and phase locking a solid state oscillator comprising:
    a master laser for generating an optical output at a frequency $f_o$;
    means for applying an RF signal at a frequency $f_l$ to said master laser to generate optical sidebands at multiples of $f_l$;
    a first slave laser adjusted to operate at approximately a given optical sideband of said master laser;
    a second slave laser adjusted to operate at approximately a different optical sideband of said master laser than said first slave laser;
    means for splitting the optical output from said master laser into at least two beams and injecting one beam into said first slave laser and injecting the other beam into said second slave laser to lock the respective slave lasers to their respective sideband frequencies in the master laser output; and
    means for combining the optical output beams from said first and second slave lasers and impinging this combined beam on said solid state oscillator to effect a locking thereof to the beat frequency between the two slave laser outputs.

2. A system as defined in claim 1, wherein said solid state oscillator being locked is an FET oscillator.

3. A system as defined in claim 2, further comprising an isolator disposed between said master laser and said splitting means.

4. A method for frequency and phase locking a solid state oscillator comprising the steps of:
    generating optical sidebands at multiples of $f_l$ in the optical output of a master laser;
    adjusting a first slave laser to operate at approximately a given optical sideband of said master laser;
    adjusting a second slave laser to operate at approximately an optical sideband of said master laser different than said first slave laser;
    splitting the optical output from the master laser into at least two beams and injecting one beam into said first slave laser and injecting the other beam into said second slave laser to lock those slave lasers to their respective sideband frequencies in the master laser output;
    combining the optical output beams from said first and second slave lasers and impinging the combined beam on said solid state oscillator to effect locking to the beat frequency between the two slave laser outputs.

* * * * *